United States Patent [19]

Taniguchi et al.

[11] Patent Number: 5,585,630
[45] Date of Patent: Dec. 17, 1996

[54] ELECTRON ENERGY FILTER AND TRANSMISSION ELECTRON MICROSCOPE PROVIDED WITH THE SAME

[75] Inventors: Yoshifumi Taniguchi, Hitachinaka; Shunroku Taya, Mito, both of Japan

[73] Assignee: Hitachi, Ltd., Tokyo, Japan

[21] Appl. No.: 502,718

[22] Filed: Jul. 14, 1995

[30] Foreign Application Priority Data

Jul. 25, 1994 [JP] Japan ................................. 6-192254

[51] Int. Cl.$^6$ ................................................ H01J 49/46
[52] U.S. Cl. ................. 250/311; 250/305; 250/396 ML
[58] Field of Search ................................ 250/311, 305, 250/396 ML, 396 R

[56] References Cited

U.S. PATENT DOCUMENTS

| 5,097,126 | 3/1992 | Krivanek | 250/305 |
| 5,177,361 | 1/1993 | Krahl et al. | 250/305 |
| 5,448,063 | 9/1995 | De Jong et al. | 250/305 |
| 5,449,914 | 9/1995 | Rose et al. | 250/305 |

FOREIGN PATENT DOCUMENTS

| 58-32347 | 2/1983 | Japan . |
| 4-294044 | 10/1992 | Japan . |

OTHER PUBLICATIONS

Ultramicroscopy 18 (1985) 159–164, North–Holland, Amsterdam, T. Oikawa et al.: *Construction of an Energy Filter for 200 kV CTEM* no month.

*Primary Examiner*—Jack I. Berman
*Assistant Examiner*—Kiet T. Nguyen
*Attorney, Agent, or Firm*—Kenyon & Kenyon

[57] ABSTRACT

An electron energy filter is structured by superposing a pair of yokes having electron beam passage holes and pole pieces on each side facing each other so as that the pole pieces are positioned facing each other with a certain space in between, and the electron energy filter is mounted in a transmission electron microscope to obtain a stable elemental mapping image.

11 Claims, 6 Drawing Sheets

ELECTRON ENERGY FILTER AND TRANSMISSION ELECTRON MICROSCOPE PROVIDED WITH THE SAME

BACKGROUND OF THE INVENTION

This invention relates to an electron energy filter and a transmission electron microscope provided with the same, and more particularly, relates to a device suitable for obtaining an elemental mapping image of a small area by separating only electrons having specific energy from an electron beam transmitted through a sample and by imaging it.

An electron energy filter is the device which resolves an electron beam transmitted through a sample and separates only electrons having energy in specific energy range, and mostly used in combination with a transmission electron microscope. Electrons transmitted through a sample lose energy which is inherent to constituent element of the sample due to inelastic scattering, therefore an electron microscopic image obtained with only electrons which lost specific energy represents the two dimensional mapping corresponding to constituent element of the sample. An electron beam containing wide energy range after transmission of a sample is filtered to allow only electrons with a specific energy range to pass, and resultant electron beam having restricted energy range images a contrasted image.

The electron energy filter is constituted with a plurality of magnetic poles comprising pole pieces which are provided facing each other with a certain gap, there is no magnetic field in a space between adjacent magnetic poles, the space is free spaces where an electron can move straight. Electrons entered into an energy filter along the center axis of an electron microscope pass through the gap between magnetic poles and the free space deviating from the center axis, then travel forward along the center axis again. An energy spectrum is obtained in the rear of the energy filter, and where specific energy is selected.

After the selection of energy, a two dimensional elemental mapping image is obtained using an imaging electron lens. The energy filter of this type is referred to as in-column type energy filter, various types such as $\Omega$-type energy filter described in Japanese Patent Provisional Publication Showa-62-66553 (1987), $\alpha$-type energy filter described in Japanese Patent Provisional Publication Showa-62-69456 (1987), and $\gamma$-type energy filter proposed by the inventors of this invention have been disclosed.

To fabricate electron energy filters of these types, magnetic poles provided facing each other are required to be formed and positioned with high accuracy, a method of fabrication of these energy filters has been disclosed in Japanese Patent Provisional Publication Heisei-4-294044 (1992) for example.

This electron energy filter is referred to as $\Omega$-type energy filter, which comprises a pair of outer plates and a pair of inner plates provided facing each other, and four magnetic poles for deflecting an electron beam are constituted with pole pieces which are provided facing each other with a certain gap in between.

Whole electron energy filter structured as described herein above is mounted in the vacuum chamber which is served as a column of the electron microscope.

Other structure of conventional energy filter (the second prior art) is described in, for example, Japanese Patent Provisional Publication Showa-58-32347 (1983), in the case of this energy filter, whole passage of electron beam in an energy filter is isolated using cylindrical non-magnetic material, and magnetic field is applied from the outside of the electron beam passage using sector magnetic poles.

In the above mentioned first prior art, whole energy filter is contained in a vacuum chamber and evacuated. In this case, all parts including the outer plates, inner plates, magnetic field exciting coils, magnetic poles, screws, and adjusting pins exist in a vacuum, therefore volume and surface area to be evacuated are very large. However, small electron beam passage holes provided at portions of entrance and exit for an electron beam are only the holes of the energy filter served as vacuum evacuation holes.

Because of these unfavorable conditions, it takes long time to evacuate the electron energy filter to a certain degree of vacuum, and gas released from coils adversely affects on the degree of vacuum and contaminates the sample. Especially when the surface morphology is observed and when an ice-embedded tissue sample is observed, the contamination of the sample is fatal. To obtain high vacuum, the evacuation under heating using a heater is required, but the heater is required to be contained in the vacuum internal in the case of this structure, therefore the evacuation under heating does not exhibits significant vacuum effect, this is a disadvantage of the first prior art.

Additionally for the first prior art described herein above, each pole piece is independent from an outer plate, these members are positioned with adjusting pins and screwed. Each plate is positioned each other with adjusting pins through an inner plate.

Each pole piece which constitutes each magnetic pole is positioned indirectly through each member, therefore, parallelism of each pole piece is represented by the total of the flatness of the plate and pole piece, parallelism between the plate and pole piece, and parallelism between the plates. Hence, the looseness of the adjusting pin and poor flat accuracy and flatness reduces the positioning accuracy and parallelism of the pole piece. On the other hand, the extremely high working accuracy and buildup accuracy are required to obtain the required positioning accuracy and parallelism, these conditions result in unfavorable cost.

On the other hand, in the second prior art described above, only the passage of electron beam is evacuated independently, therefore, the second prior art is not involved in the vacuum problem different from the first prior art. However, the passage of an electron beam used for the second prior art is made by welding tubes consisting of non-magnetic material which have been bent to fit the passage of electron beam or welding plates which are provided with grooves to fit the passage of electron beam. During the welding, the members are heated to cause partial distortion and magnetization depending on the material, the magnetization often causes the deviation of electron beam from the passage.

The welding buildup of the electron beam passage often causes vacuum leak. The electron beam passage is located in the gap between pole pieces and the tube of non-magnetic material is placed in the gap, such structure reduces the space available for the electron beam passage to a half. On the other hand, if the transmission of electrons is improved by increasing the inside diameter of the electron beam passage and the space between pole pieces, coil current should be increased in proportion to the space between magnetic poles to obtain required magnetic field, the increased coil current causes the drift due to heating of the coil and deviation of the electron beam position, these are disadvantages of the second prior art.

SUMMARY OF THE INVENTION

It is an object of the present invention to provide an electron energy filter having reduced surface area exposed to the vacuum and having high positioning accuracy of pole pieces.

It is another object of the present invention to provide a transmission electron microscope which allows easy evacuation and is capable of imaging a stable elemental mapping with high resolution.

An electron energy filter in accordance with the present invention is provided with a pair of yokes having holes for passage of electron beam, and pole pieces provided on each facing side of the pair of yokes, wherein the pair of yokes are placed in parallel so as that the pole pieces are facing each other keeping a certain gap.

A transmission electron microscope in accordance with the present invention is provided with the electron energy filter in a space in the transmission electron microscope at the position which is coincident with the center axis of electron beam after transmission through a sample of the transmission electron microscope.

In the present invention, an analyzer chamber consisting of non-magnetic material is provided between the pair of yokes, and the analyzer chamber is variously modified to improve the performance, thus the present invention provides excellent structures in addition to objects and features described hereinbefore, and these excellent structures will be described also in the embodiments described hereinafter in detail.

DESCRIPTION OF THE PREFERRED EMBODIMENT

Figure 1:
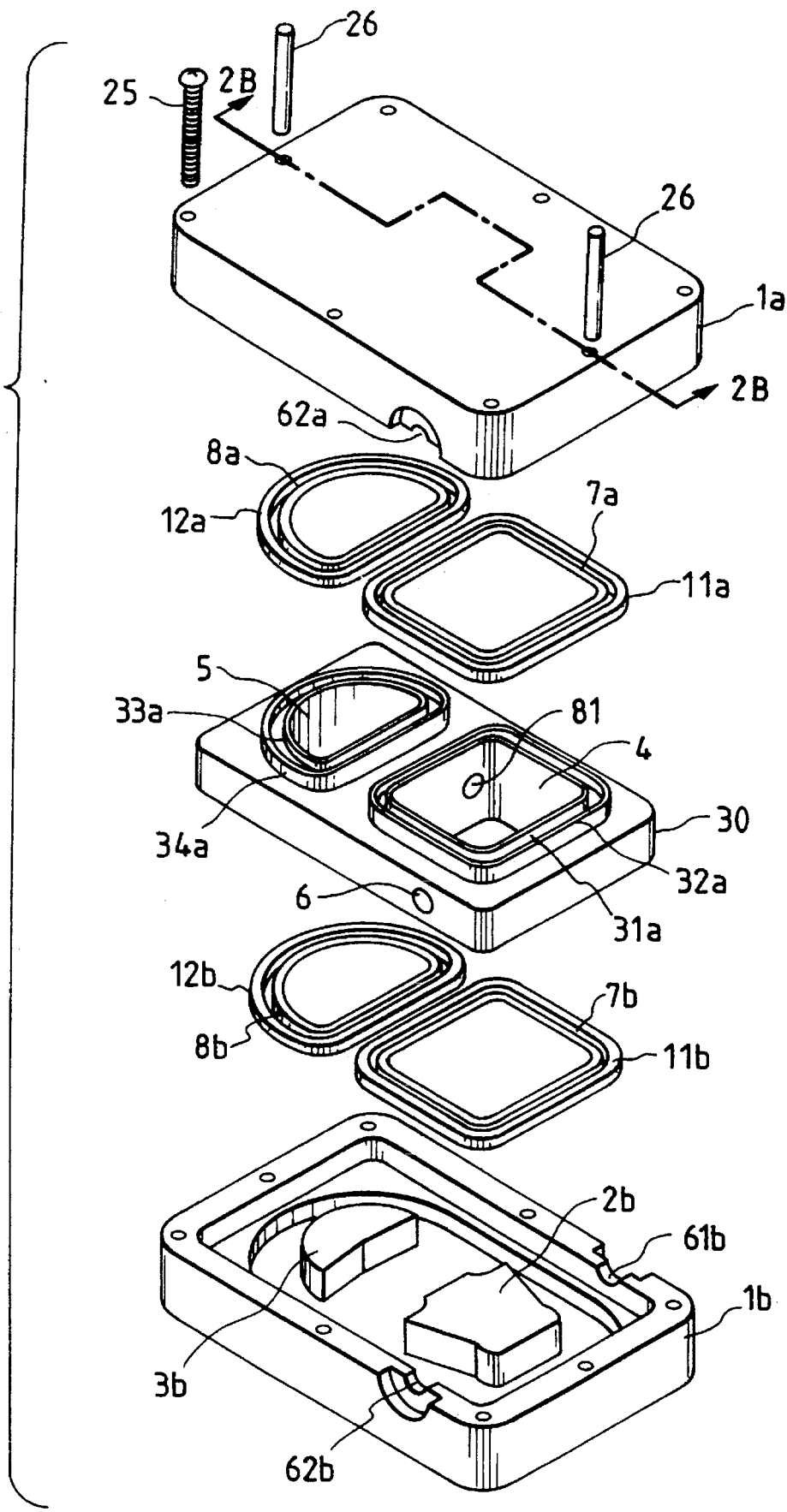
FIG. 1 is an assembling drawing of one embodiment of an electron energy filter in accordance with the present invention.

An embodiment of the present invention will bedescribed in detail referring to the drawings hereinafter.

The whole structure of a transmission electron microscope in accordance with the present invention is described in the first place.

Figure 8:
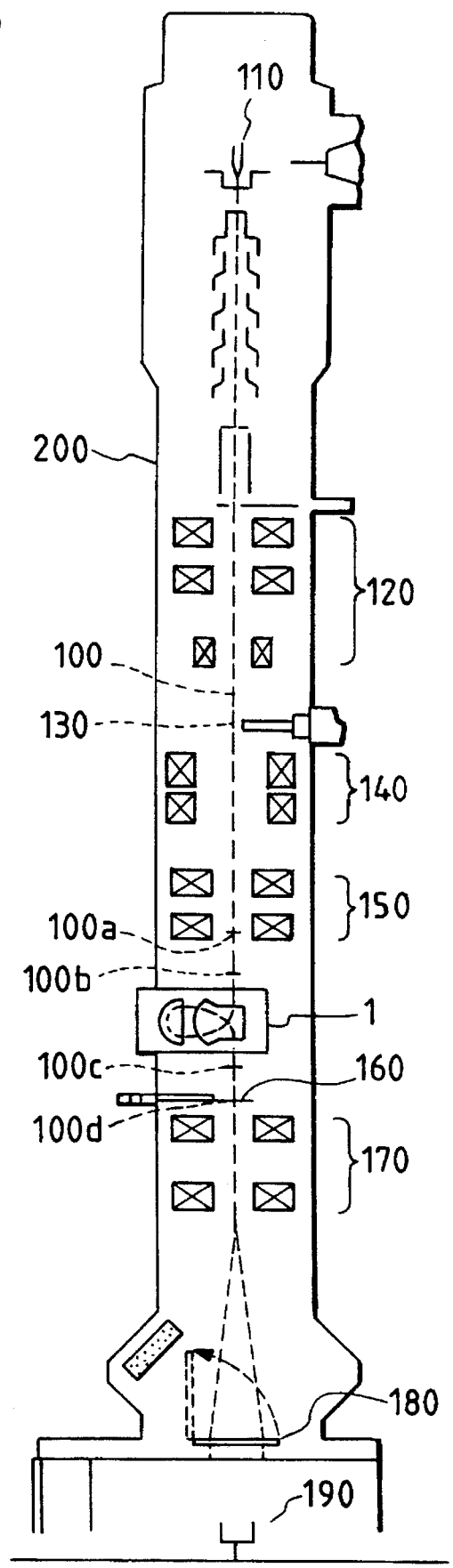
FIG. 8 is a schematic diagram for illustrating the whole structure of a transmission electron microscope in accordance with the present invention.

As shown in FIG. 8, an electron energy filter 1 is a so-called in-column type electron energy filter which is provided between intermediate lenses 150 and projection lenses 170. An electron beam 100 emitted from an electron gun 110 is converged with condenser lenses 120, subsequently transmits a sample 130, is enlarged with objective lenses 140, converged at a cross-over point 100a with the intermediate lenses 150, makes a turn at the electron energy filter 1, and is re-converged at a energy dispersion point 100d, when electrons with different energy is dispersed to form a line spectrum by magnetic field. A variable slit 160 is provided at the energy dispersion point 100d for selection of specific energy band.

On the other hand, an incident image plane 100b imaged with the intermediate lenses 150 is re-imaged at an exit image plane 100c with the electron energy filter 1. The exit image will not blur due to offset of dispersion with the electron energy filter 1, namely so-called achromatic effect, even if the electron beam 100 has energy distribution.

The exit image 100c of the electron beam 100 having specific energy obtained by selection with the variable slit 160 is enlarged and imaged on a fluorescent screen 180. 190 is a detector and 200 is a column of the microscope.

Magnetic poles of the electron energy filter 1 are wound with coils as described herein under, the poles generate magnetic field so as that the electron beam describes a specific path depending on accelerating voltage of electron.

On the fluorescent screen 180, a stable electron beam image with high resolution is imaged, which electron beam has selected energy selected from the electron beam 100 transmitted through the sample 130.

Figure 2:
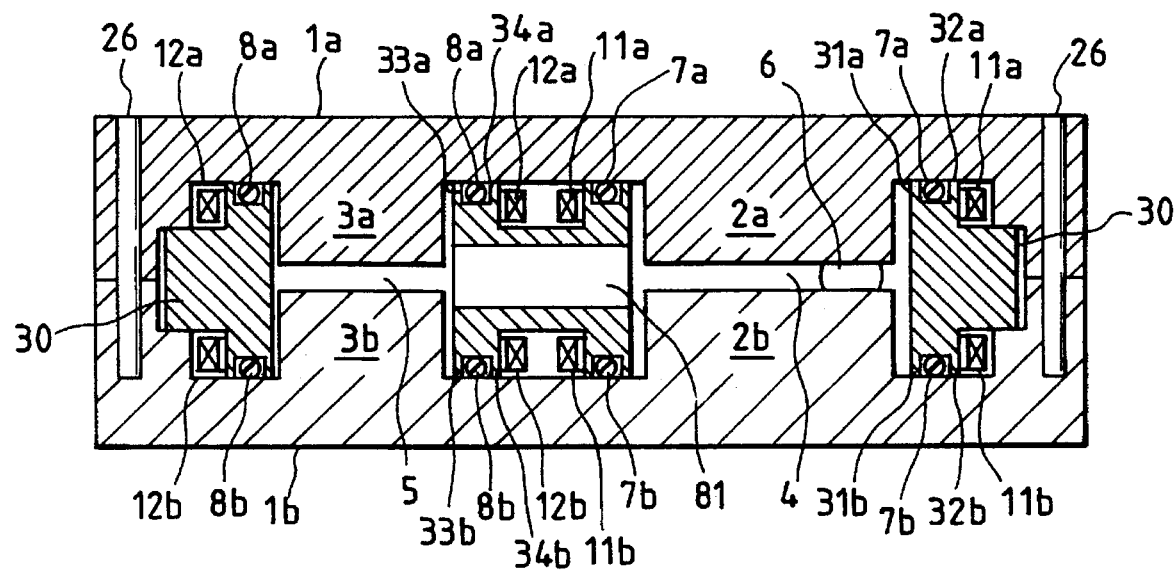
FIG. 2 is a cross sectional view of the electron energy filter shown in FIG. 1.
Figure 3:
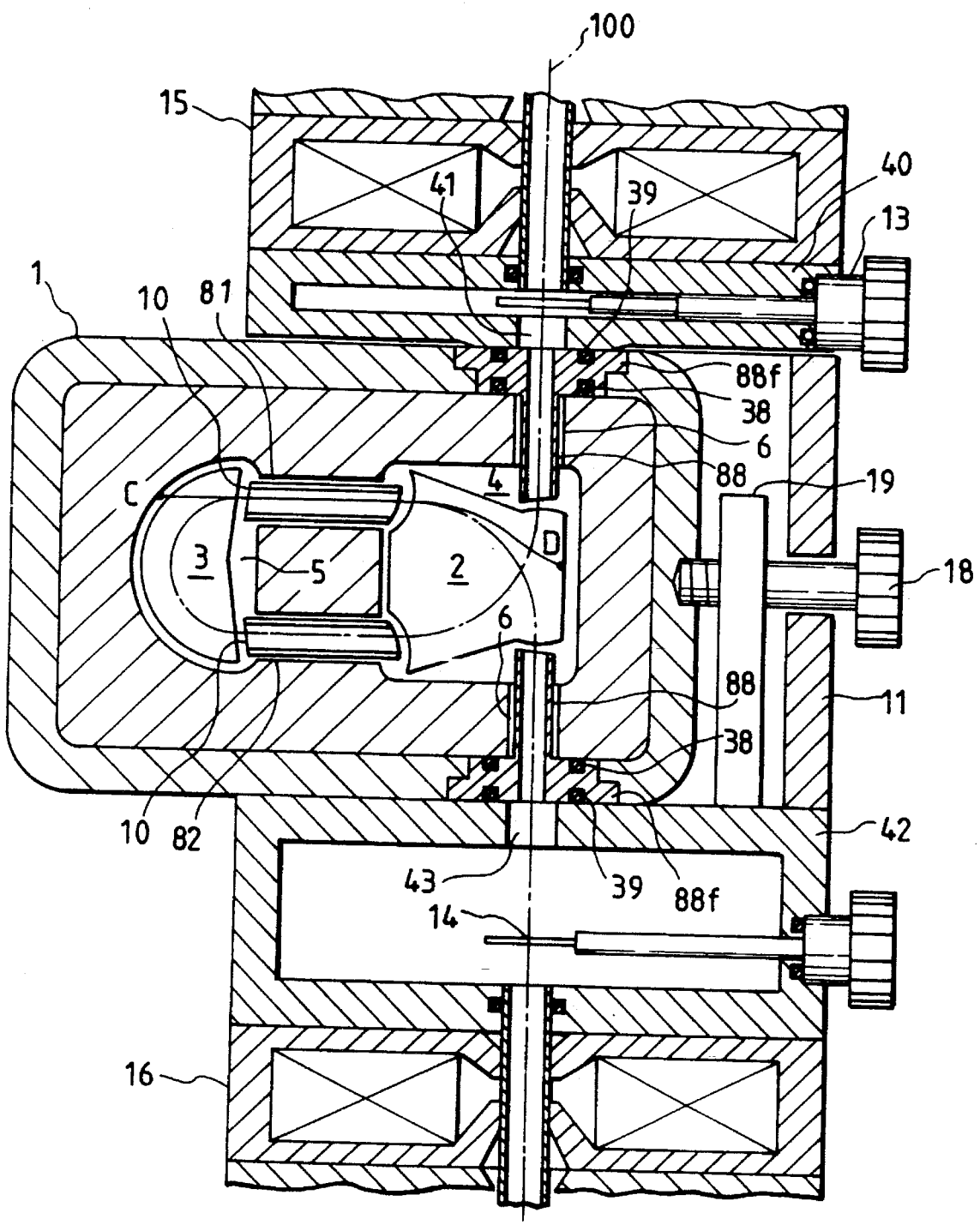
FIG. 3 is a longitudinal sectional view of the electron energy filter shown in FIG. 1.

The structure of an electron energy filter in accordance with the present invention is described herein under. FIG. 1 is an assembling drawing for illustrating the structure of the electron energy filter for the embodiment, FIG. 2 is a sectional view taken substantially along the line B—B of FIG. 1 after buildup, and FIG. 3 is a sectional view of the electron energy filter mounted in a transmission electron microscope, wherein γ-type electron energy filter is described as an example.

A pair of yokes 1a and 1b provided facing each other with an interposed analyzer chamber 30 in between is consists of solid ferromagnetic material and the major portion of the yokes has substantially mutual mirror symmetrical configuration. The yokes 1a and 1b face each other, and the up side and down side of the analyzer chamber 30 each other have approximately the same configurations, therefore in the description hereinafter, each member provided or formed between the yoke 1a and the analyzer chamber 30 is attached with the symbol "a", and each member provided or formed between the yoke 1b and the analyzer chamber 30 is attached with the symbol "b" to distinguish between the both. The structure in another side will be omitted in description occasionally.

At the facing positions on facing sides of the yokes 1a and 1b, pole pieces 2a and 3a, and 2b and 3b are formed, which pole pieces are formed solidly with the yokes and constitute magnetic poles 2 and 3 of the electron energy filter, and the yokes 1a and 1b have peripheral ridges respectively which are fit each other when the yokes 1a is placed on the yoke 1b, on the ridges notches 61a and 61b, and 62a and 62b are formed to provide a passage hole 61 for the incidence of the electron beam transmitted through the sample and a passage hole 62 for the exit of the electron beam after deflection respectively.

On the analyzer chamber 30, two openings 4 and 5 are provided for insertion of the two pairs of pole pieces 2a and 2b, and 3a and 3b, and on the peripheries of openings 4 and 5 facing to the yoke 1a, ribs 31a and 32a for the opening 4 and ribs 33a and 34a for the opening 5 are provided. Similarly, on the peripheries of openings 4 and 5 facing to the yoke 1b, ribs 31b, 32b, 33b, and 34b are provided.

Between the ribs 31a and 32a and between the ribs 33a and 34a, vacuum packings 7a and 8a are inserted respectively, and around the ribs 32a and 34a exciting coils 11a and 12a are provided for exciting the pole pieces 2a and 3a respectively. Similarly, between the ribs 31b and 32b and between the ribs 33b and 34b, vacuum packings 7b and 8b are inserted respectively, and around the ribs 32b and 34b exciting coils 11b and 12b are provided for exciting the pole pieces 2b and 3b respectively.

Through the wall between the two openings 4 and 5 of the analyzer chamber 30, two through holes 81 and 82 connecting the opening 4 and the opening 5 are provided. On the analyzer chamber 30, an electron beam passage 6 passing from the end face for the incident electron beam to the end face for the exit electron beam through the opening 4 is provided.

In the structure as described herein above, the yokes 1a and 1b and the analyzer chamber 30 are superposed, the yokes 1a and 1b are positioned in the horizontal direction each other by inserting adjusting pins 26, and fixed with screws 25. Thereby as shown in FIG. 2, in the openings 4 of the analyzer chamber 30, the pole pieces 2a and 2b formed on the sides facing each other of the yoke 1a and 1b respectively are provided in the position facing each other with a space maintaining a certain magnetic field in between, and similarly for the openings 5 of the analyzer chamber 30, the pole pieces 3a and 3b formed on the sides facing each other of the yoke 1a and 1b respectively are provided in the position facing each other with a space maintaining a certain magnetic field in between. The notches 61a and 61b, and 62a and 62b formed on the peripheries of the yokes 1a and 1b constitute the openings coaxially with the electron beam passage 6 of the analyzer chamber 30, and the notches 61a and 61b are served as an incident passage hole 61 for the electron beam 100 and the notches 62a and 62b are served as a exit passage hole 62. The internal of the analyzer chamber 30 is evacuated through the electron beam passage holes 61 and 62 and the electron beam passage 6.

In FIG. 3, the divergent angle of the incident electron beam to the electron energy filter is limited with a selector aperture 13, the electron beam is imaged with an intermediate lens 15, the electron beam is energy-resolved with the electron energy filter, only the electron beam having selected energy selected with an energy selecting slit 14 passes to a projecting lens 16, and finally an electron microscopic image is formed. On a slit housing 40, an opening end 41 of the electron beam passage of the electron microscope is formed, on another slit housing 42 an opening end 43 is formed, and the both ends are joined with the electron energy filter 1.

The electron beam 100 which is incident to the electron energy filter from the one electron beam passage hole 61 along the center axis of the electron microscope passes the incident electron beam passage 6, the direction of the passage of the electron beam is turned by about 90 degrees by deflection between the magnetic pole 2 (pole pieces 2a and 2b), subsequently the electron beam passes the through hole 82 to the magnetic pole 3 (3a and 3b). At the magnetic pole 3, the direction of the electron beam 100 is turned by about 180 degrees, then the electron beam passes to the magnetic pole 2 again through the through hole 81. At the magnetic pole 2, the direction of the electron beam 100 is turned by 90 degrees again, the electron beam passes through the electron beam passage 6 and passes along the center axis of the electron microscope, and comes out form another electron beam passage hole 62 to the outside of the electron energy filter.

As described hereinbefore, according to the present invention, the magnetic poles 2 and 3 are formed solidly with the yoke 1, therefore, the pole pieces provided facing each other are positioned accurately and easily. By using the analyzer chamber 30, the surface area and volume which are exposed to vacuum are reduced, the evacuation speed, degree of vacuum, and quality of vacuum are improved to prevent the sample from contamination. According to the present invention, a large vacuum chamber is not required, the apparatus is minimized in size and made light weight.

In the structure described hereinbefore the analyzer chamber 30 is made of non-magnetic material, therefore, the leakage magnetic field exists in the through holes 81 and 82 and the electron beam passage 6. In this embodiment, inside the through holes 81 and 82 and the electron beam passage 6, cylindrical magnetic shielding cylinders 10 and 88 made of ferromagnetic material are inserted to exclude leakage magnetic field and to allow the electron beam to pass straight.

Figure 5:
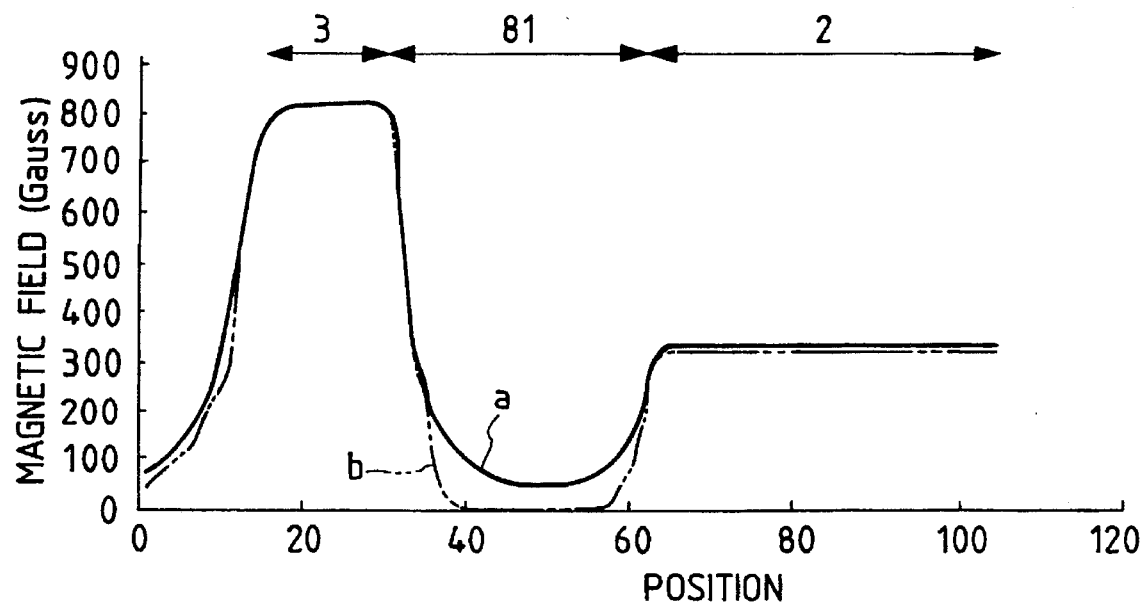
FIG. 5 is a graph describing the magnetic filed distribution in the electron energy filter shown in FIG. 3.

FIG. 5 is a graph for describing the experimental result of magnetic field distribution measurement along a curve connecting D and C in FIG. 3, the curve CD is the path of a probe used for the measurement. In FIG. 5, the continuous line shows the distribution for the case without insertion of the magnetic shielding cylinder 10 and the rough dotted line b shows the distribution for the case with insertion of the magnetic shielding cylinder 10. It is obvious from the figure that with insertion of the magnetic shielding cylinder 10, the leakage magnetic field in the through hole 81 is shielded completely to allow the electron beam to pass straight in the through hole 81.

The magnetic field configuration at the ends of the magnetic poles 2 and 3 where the electron beam enters to and comes out affects significantly on the performance of the electron energy filter, the ends of the pole pieces are formed irregularly in shape such as slant or curved to compensate the aberration of the electron energy filter. Therefore, it is desirable that at the end sides of the magnetic shielding cylinders 10 and 88 which are facing to the pole pieces, the end sides are formed in slant or curved to maintain gaps between the cylinder ends and the ends of magnetic poles at a certain distance. By providing the magnetic shielding cylinders, the ends of which are in parallel with the magnetic pole configuration, the distribution of magnetic filed at the ends of magnetic poles is shaped properly, and the ideal electron optical performance is attained.

Figure 6:
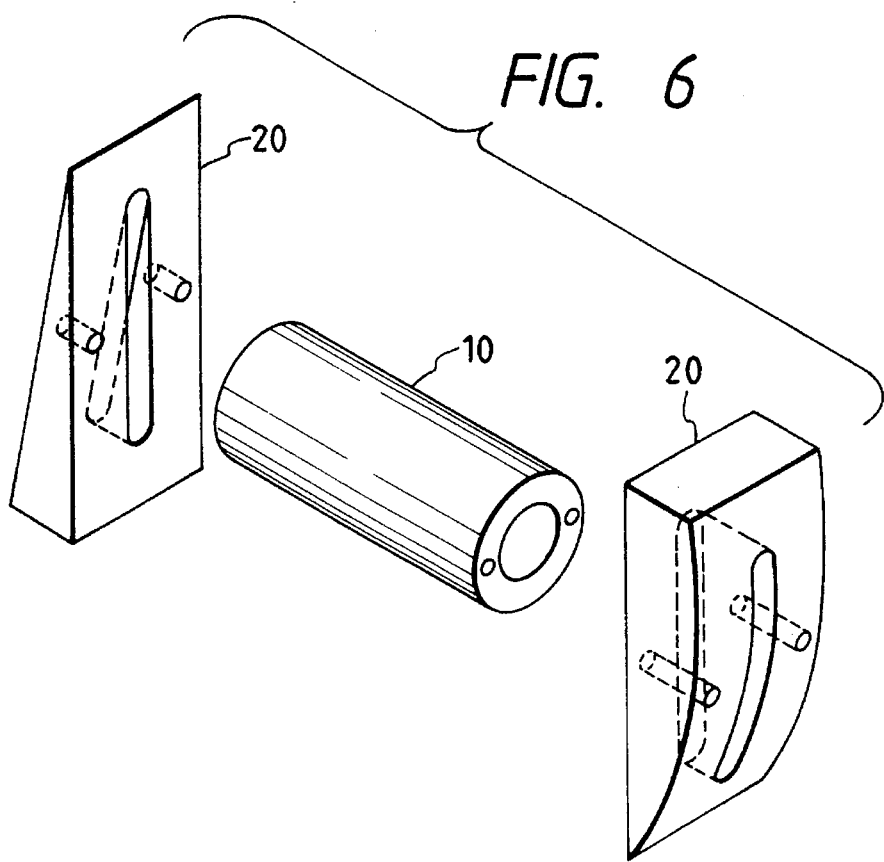
FIG. 6 is an assembling drawing of a magnetic shielding cylinder used in the embodiment.

When the shaping of the magnetic field is insufficient with the cylindrical magnetic shielding member shown in FIG. 3, magnetic shielding poles 20 made of ferromagnetic material may be provided on the ends of the magnetic shielding cylinder 10, which poles 20 are formed so as to fit with the configuration of gaps between open ends of the through holes 81 and 82 and the pole pieces as shown in FIG. 6. Thereby, the ideal end magnetic field distribution is obtained, and the aberration of the electron energy filter is significantly improved.

In this embodiment, the openings of the electron beam passage holes 61 and 62 of the yoke 1 are larger than the openings of the electron beam passage 6 of the analyzer chamber so as that openings and vicinity of the openings at electron beam incident side and electron beam exit side of the electron beam passage 6 provided in the analyzer chamber 30 are exposed at the electron beam passage holes 61 and 62. A flange 88f of the magnetic shielding cylinder 88 is contained in the electron beam passage holes 61 and 62, the vicinity of the openings of the electron beam passage 6 of the analyzer chamber 30, and the inside of the flange 88f are sealed air-tight with vacuum packing 38. The electron beam passage of the transmission electron microscope side is sealed air-tight with vacuum packing 39 provided outside the flange 88f.

Figure 4:
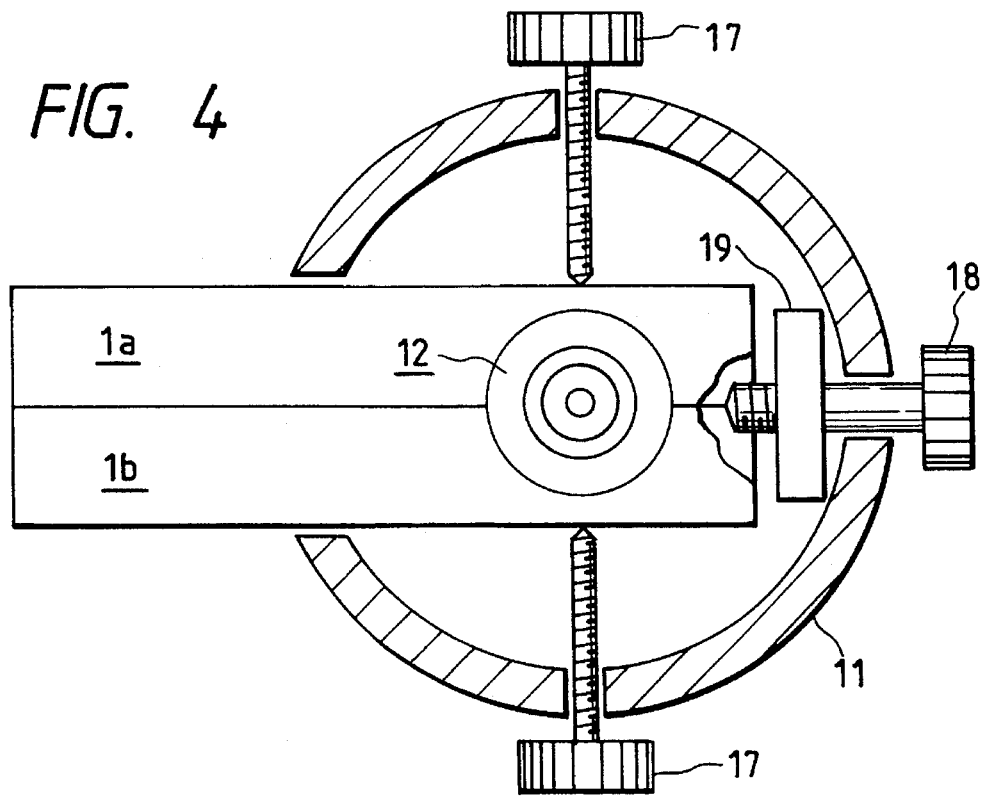
FIG. 4 is a schematic diagram of an electron energy filter mounted on an electron microscope.

FIG. 4 is a plane view of the center axis adjusting mechanism viewed from the electron beam incident side for describing the center axis adjusting mechanism of the electron energy filter which is mounted in the transmission electron microscope. In the case of the structure in which the air-tight is maintained using the magnetic shielding cylinder 88 as described in this embodiment, the adjustment of position of the electron energy filter and the coinciding of the center axis of the electron energy filter with the center axis of the electron microscope are possible remotely at the atmospheric side, the electron energy filter can be moved in the direction of energy dispersion and in vertical direction using an adjusting screw 17 mounted directly on a column 11. For example, the electron energy filter is moved toward energy dispersion direction with a screw 18 and a disk 19 for fixing the screw 18.

A current required to deflect the electron beam is fed to an exciting coil 7, and the temperature change of the exciting coil 7 is measured to find the temperature rise of about 5° C. after about 1 hr and then no rising. In this embodiment, the gap between the magnetic poles can be narrowed, thereby, reduced coil current is enough to operate, and the temperature rise of the coil is negligibly small to allow a cooler to be eliminated.

In the structure of the embodiment described hereinbefore, the pole pieces are formed solidly with the yokes 1a and 1b and the analyzer chamber 30 is provided between the yokes 1a and 1b, however, if only the relative positioning of the pole pieces is addressed to improve and the reduction of surface area exposed to vacuum is not addressed, the analyzer chamber 30 is not necessarily required. Contrary, if only the reduction of surface area exposed to vacuum is addressed to improve and the relative positioning of the pole pieces is not addressed, the forming of the pole pieces solidly with the yokes 1a and 1b is not necessarily required.

In the embodiment described hereinbefore, the application to two pole γ-type electron energy filter is described, the present invention is not limited to the case but applied to other types of electron energy filters such as Ω-type electron energy filter.

Figure 7:
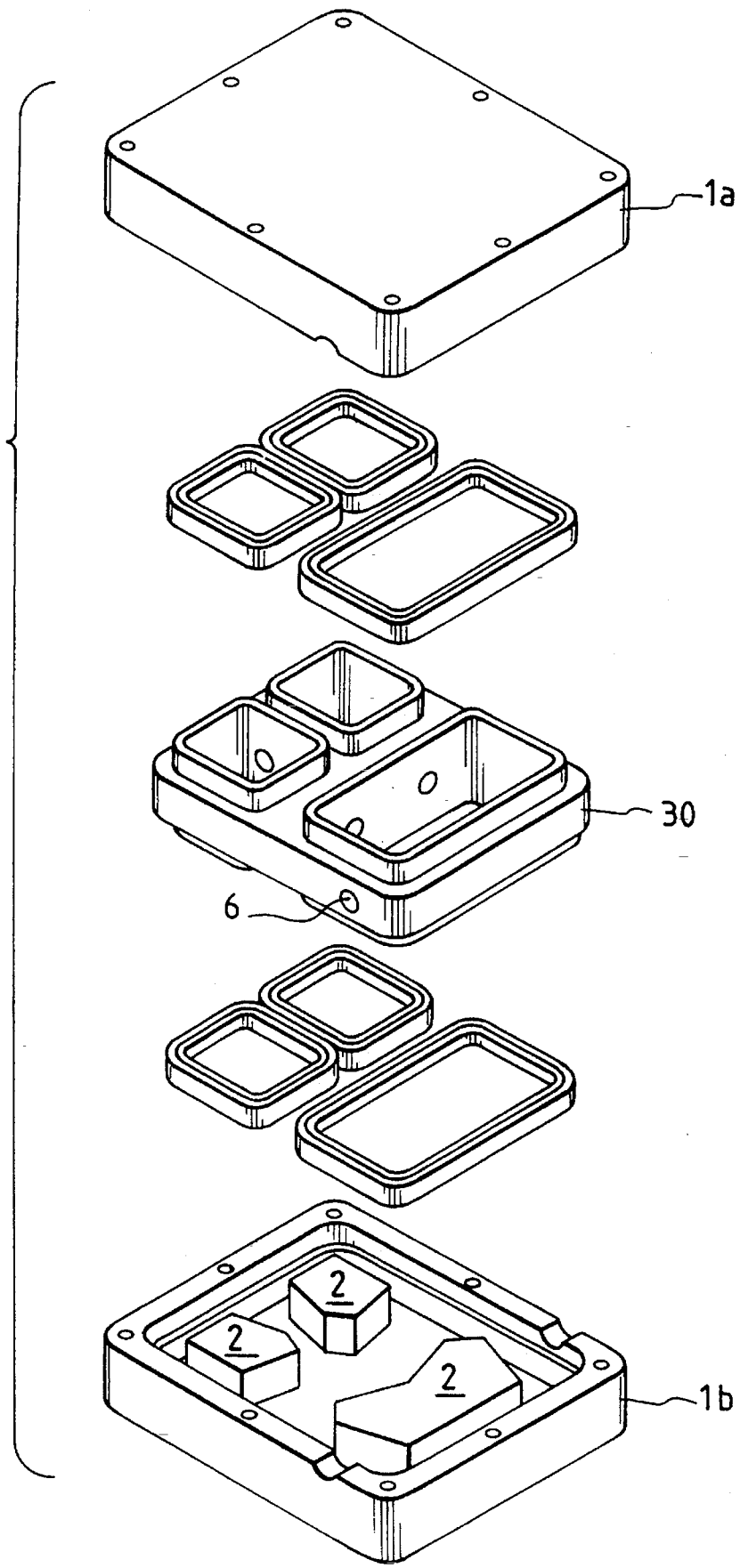
FIG. 7 is an assembling drawing of an $\Omega$-type energy filter in accordance with the present invention.

FIG. 7 is an assembling drawing for illustrating the structure of an Ω-type electron energy filter applied with the present invention, the same symbols represent the corresponding members respectively. In this embodiment, three magnetic poles 2 are used different from the prior embodiment, but the structure that an analyzer chamber 30 is provided between yokes 1a and 1b is the same. As described herein, the present invention can be applied to any type of electron energy filter utilizing magnetic field.

As described hereinbefore, the various effects are accomplished according to the present invention.

(1) Pole pieces provided facing each other are positioned accurately and easily in the relative position because the pole pieces are formed solidly with yokes.

(2) The evacuation speed, degree of vacuum, and quality of vacuum are improved to prevent the sample from contamination because the surface area and volume exposed to vacuum are reduced by introducing the use of an analyzer chamber. A large vacuum chamber is not required, thereby, the apparatus is minimized in size and made light weight.

(3) Heat-degassing of an electron energy filter is easy because the yoke is partially exposed to the outside of vacuum. The mechanical position of the electron energy filter is adjustable at the atmospheric pressure side without complex vacuum mechanism.

(4) The gap between pole pieces provided facing each other is narrowed to the width of electron beam divergence because the full range of the gap is served for electron beam passage. The heat generation is suppressed because the reduced coil current is enough to generate the magnetic field required.

(5) Bending and welding are not required for making the analyzer chamber, thereby, the deformation and magnetization due to heating are prevented.

(6) The leakage magnetic field in through holes is eliminated because magnetic shielding cylinders are inserted in the through holes of the analyzer chamber.

(7) The aberration of the electron energy filter is suppressed if the end configuration of the magnetic shielding cylinders is formed so as to be in parallel with the surface of pole pieces facing to the cylinders.

What is claimed is:

1. An electron energy filter, which separates and emits only an electron beam having a specific energy from an incident electron beam, comprising:

a pair of yokes superposed tightly so that a plurality of pole pieces provided on planes of said yokes facing each other respectively are facing each other with a certain gap in between;

an electron beam passage hole provided in said yokes;

exciting coils for generating magnetic field between said pole pieces by exciting said pole pieces, and the incident electron beam from the one end of said electron beam passage hole being deflected between pole pieces, then emitted from another end of said electron beam passage hole;

wherein said electron energy filter is provided with an analyzer chamber made of non-magnetic material and provided between said pair of yokes, said analyzer chamber is provided with:

a plurality of openings in which said pole pieces provided on said planes of said yokes facing each other respectively are inserted, an electron beam through hole connecting said plurality of openings, electron beam passages connecting said electron beam passage hole provided in said yokes to any of said openings, air-tight sealing members provided around the periphery of opening areas of said openings and fit on the facing planes of said each yoke facing each other, and said exciting coils provided on the periphery of said air-tight sealing members, for exciting said pole pieces inserted from the opening areas to the openings.

2. An electron energy filter as claimed in claim 1, further comprising a magnetic shielding cylinder made of ferromagnetic material inserted in said through hole of said analyzer chamber.

3. An electron energy filter as claimed in claim 2, wherein said magnetic shielding cylinder is inserted so as to be projected into said opening from said through hole, and the end thereof is shaped so as to be distant with a prescribed constant distance from the side of said pole piece facing to said end.

4. An electron energy filter as claimed in claim 2, wherein said magnetic shielding cylinder comprises:

a cylinder body to be inserted in said through hole; and magnetic shielding pole which is fixed on at least one end of said cylinder body and projects to said opening, and which is formed so as to be distant with a prescribed constant distance from the side of said pole piece.

5. An electron energy filter as claimed in claim 1, further comprising a second magnetic shielding cylinder made of ferromagnetic material inserted in one of said electron beam passages of said analyzer chamber.

6. An electron energy filter as claimed in claim 5, wherein said second magnetic shielding cylinder comprises a cylinder body at one end thereof and a ring flange at another end thereof, and said second magnetic shielding cylinder is inserted with heading of the cylinder body in said electron beam passage through said electron beam passage hole, the opening of which hole is larger than the opening of said electron passage of said analyzer chamber, said flange is contained in said electron beam passage hole, and the exposed surface of said analyzer chamber and the inside of said flange are air-tight sealed with said air-tight sealing members.

7. An electron energy filter as claimed in claim 6, wherein said second magnetic shielding cylinder is provided with a magnetic shielding pole which is fixed at the one end of the cylinder body inserted in said electron beam passage and projected into said opening, and is formed so as to be distant with a prescribed constant distance from the side of said pole.

8. An electron energy filter as claimed in claim 5, wherein the one end of said second magnetic shielding cylinder is provided so as to project from said electron beam passage to said opening, the end is shaped so as to be distant from the side of said pole piece with a prescribed constant distance.

9. A transmission electron microscope as claimed in claim 1, wherein said microscope is provided with a space for insertion of said electron energy filter, on each facing side of said space, opening ends of the electron beam passage are exposed, said electron energy filter is inserted so as that electron beam passage holes of said electron energy filter coincide with said exposed opening ends of the electron beam passage respectively, and said electron beam passage holes and said opening ends of the electron beam passage are air-tight sealed with air-tight sealing members.

10. A transmission electron microscope as claimed in claim 9, further comprising a means for moving said electron energy filter in said space in a plane perpendicular to the axis of said electron beam.

11. A transmission electron microscope as claimed in claim 9, further comprising a heating means for heat-degassing at the exposed portion of said electron energy filter.

* * * * *

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 1 | 12 | Change "it" to --the sample--. |
| 1 | 15 | After "in" insert --a--; change "range, and" to --range. It is--. |
| 1 | 18 | Change "element" to --elements--. |
| 1 | 20 | After "which" insert --have--. |
| 1 | 21 | Before "specific" insert --this--; change "two dimensional" to --two-dimensional--. |
| 1 | 22 | Before "constituent" insert --the--. |
| 1 | 24 | Change "with" to --within--. |
| 1 | 26 | Change "images" to --provides--. |
| 1 | 29 | Change "gap, there" to --gap. There--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 1 | 30 | Delete "the space". |
| 1 | 31 | Change "is" to --but rather--. |
| 1 | 32 | Change "entered" to --enter--. |
| 1 | 33 | After "microscope" insert --and--. |
| 1 | 53 | After "as" insert --an--. |
| 1 | 60 | Change "Whole" to --The whole--. |
| 1 | 61 | After "chamber" delete "which is". |
| 1 | 62 | Delete "served as a column". |
| 1 | 63 | Change "Other" to --Another--. |
| 1 | 66 | Change "whole" to --the--. |
| 2 | 3 | Change "whole" to --the--. |
| 2 | 14 | After "affects" delete "on". |

UNITED STATES PATENT AND TRADEMARK OFFICE
CERTIFICATE OF CORRECTION

PATENT NO. : 5,585,630

DATED : December 17, 1996

INVENTOR(S) : Yoshifumi TANIGUCHI et al.

It is certified that error appears in the above-indentified patent and that said Letters Patent is hereby corrected as shown below:

| Column | Line | |
|---|---|---|
| 2 | 28 | After "Each" delete "pole piece which constitutes each magnetic pole" and insert therefor --plate--. |
| 2 | 29 | Change "member, therefore," to --plate. Therefore,--. |
| 2 | 35 | After "hand," change "the" to --as--. |
| 2 | 42 | Change "different from" to --as in--. |
| 2 | 54 | Change "gap, such" to --gap. Such--. |
| 2 | 60 | Change "field, the" to --field. The--. |
| 2 | 62 | Change "position, these" to --position. These--. |
| 3 | 5 | Change "imaging" to --creating--; change "mapping" to --image--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 3 | 54 | Change "bedescribed" to --be described--. |
| 4 | 1 | Change "is" to --are--. |
| 4 | 4 | After "of" insert --a--. |
| 4 | 9 | After "namely" insert --, the--. |
| 4 | 10 | Before "energy" insert --a wide--. |
| 4 | 27 | Change "B-B" to --2B-2B--. |
| 4 | 32 | Before "provided" insert --are--. |
| 4 | 33 | Change "between is" to --between. It--. |
| 4 | 38 | Change "configurations, therefore" to --configurations. Therefore--. |
| 4 | 47 | Change "formed, which" to --formed. These--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 4 | 50 | Change "filter, and the" to --filter. The--. |
| 4 | 51 | Delete "respectively". |
| 4 | 52 | Delete "are"; delete "the" (two occurrences); change "yokes 1a" to --yoke 1a--. |
| 4 | 53 | Change "on the ridges" to --so that--. |
| 5 | 9 | Change "On" to --In--. |
| 5 | 15 | After "superposed" change ", the" to --. The--. |
| 5 | 16 | Change "in the horizontal direction" to --opposite--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 5 | 21 | After "respectively" insert --,--. |
| 5 | 22 | After "between" change "," to --.--. |
| 5 | 23 | Change "and similarly" to --Similarly,--. |
| 5 | 31 | Change "are served" to --act--. |
| 5 | 32 | Change "are served" to --act--. |
| 5 | 33 | Delete "internal of the". |
| 5 | 38 | Change "13, the" to --13. The--. |
| 5 | 39 | Change "15, the" to --15. The--. |
| 5 | 40 | Change "filter, only" to --filter. Only--; delete "selected". |
| 5 | 41 | Before "selected" insert --levels--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 5 | 42 | Change "16, and finally" to --16. Finally--. |
| 5 | 45 | Change "formed, on" to --formed. On--. |
| 5 | 46 | Change "formed, and the" to --formed. The--. |
| 5 | 49 | Delete "which is incident to the electron" and insert --passes--. |
| 5 | 50 | Delete "energy filter". |
| 5 | 51 | Change "passes" to --to--. |
| 5 | 52 | Change "passage 6, the" to --passage 6. The--. |
| 5 | 55 | Change "and 2b), subsequently" to --and 2b). Subsequently,--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 5 | 58 | Change "degrees, then" to --degrees. Then--. |
| 5 | 59 | Change "81. At the" to --81, where--. |
| 5 | 60 | Delete "magnetic pole 2,". |
| 5 | 61 | Change "again, the" to --again. The--. |
| 5 | 63 | Change "form" to --from--. |
| 6 | 1 | Delete "provided". |
| 6 | 4 | After "reduced," insert --so--. |
| 6 | 10 | Change "material, therefore, the" to --material. Therefore,--. |
| 6 | 11 | Delete "leakage"; change "exists" to --leaks--. |
| 6 | 15 | After "material" insert --,--; after "leakage" insert --of the--. |

UNITED STATES PATENT AND TRADEMARK OFFICE
CERTIFICATE OF CORRECTION

PATENT NO. : 5,585,630

DATED : December 17, 1996

INVENTOR(S) : Yoshifumi TANIGUCHI et al.

It is certified that error appears in the above-indentified patent and that said Letters Patent is hereby corrected as shown below:

| Column | Line | |
|---|---|---|
| 6 | 27 | After "leakage" insert --of the--. |
| 6 | 32 | After "enters" delete "to". |
| 6 | 33 | After "significantly" delete "on". |
| 6 | 34 | Change "filter, the" to --filter. The--. |
| 6 | 37 | After "that" delete "at". |
| 6 | 38 | After "pieces," delete "the". |
| 6 | 39 | Delete "end sides"; change "formed in slant" to --slanted--. |
| 6 | 43 | Change "filed" to --field--. |
| 7 | 8 | Change "In the case of the structure" to --In this structure,--. |
| 7 | 9 | Change "air-tight" to --vacuum--. |
| 7 | 14 | Change "side, the" to --side. The--. |

UNITED STATES PATENT AND TRADEMARK OFFICE
CERTIFICATE OF CORRECTION

PATENT NO. : 5,585,630
DATED : December 17, 1996
INVENTOR(S) : Yoshifumi TANIGUCHI et al.

It is certified that error appears in the above-indentified patent and that said Letters Patent is hereby corrected as shown below:

| Column | Line | |
|---|---|---|
| 7 | 34 | Change "Contrary," to --Contrariwise,--. |
| 7 | 40 | After "described" change "," to --.-- and insert --However,--. |
| 7 | 41 | Change "the case" to --this case,--; after "but" insert --may be--. |
| 7 | 42 | After "as" insert --the--. |
| 7 | 48 | Change "different" to --differently--. |
| 7 | 49 | Change "the structure" to --similarly in--. |
| 7 | 50 | Delete "is the same". |
| 7 | 52 | After "utilizing" insert --a--. |
| 8 | 12 | After "leakage" insert --of the--. |

Signed and Sealed this

Tenth Day of June, 1997

Attest:

BRUCE LEHMAN

Attesting Officer

Commissioner of Patents and Trademarks